United States Patent [19]

Tieke

[11] Patent Number: 4,562,141
[45] Date of Patent: Dec. 31, 1985

[54] POLYMERISABLE COMPOSITION COMPRISING CONJUGATED DIACETYLENIC COMPOUNDS, MATERIAL COATED THEREWITH AND THE USE THEREOF

[75] Inventor: Bernd Tieke, Freiburg, Fed. Rep. of Germany

[73] Assignee: Ciba Geigy Corporation, Ardsley, N.Y.

[21] Appl. No.: 534,523

[22] Filed: Sep. 21, 1983

[30] Foreign Application Priority Data

Sep. 29, 1982 [CH] Switzerland ............... 5776/82

[51] Int. Cl.$^4$ .................. G03C 1/68; G03C 1/70; C08F 38/00
[52] U.S. Cl. .................... 430/281; 430/270; 430/283; 430/926; 526/285; 526/288; 252/600; 522/34; 428/220
[58] Field of Search ............... 430/270, 281, 283, 926; 204/159.22, 159.23, 159.24; 252/600; 526/285, 288

[56] References Cited

U.S. PATENT DOCUMENTS 4,189,399  2/1980  Patel ................... 252/600
4,208,501  6/1980  Yee et al. ............... 252/600
4,314,021  2/1982  O'Brien et al. ........... 430/270

FOREIGN PATENT DOCUMENTS 22618  1/1981  European Pat. Off. .

OTHER PUBLICATIONS

Sally S. Fico, "Spectral Sensitization of Radiation-Sensitive Polyyne Compounds", *Research Disclosure*, Jan. 1976, No. 14148, pp. 42–43.
B. Tieke et al., J Poly Sci, Poly. Chem Ed, 17, 1631, (1979).
J. Sondermann, Liebigs Ann. Chem. 749, 183, (1971), (=Ca, 75, 130762j (1971)).

*Primary Examiner*—John E. Kittle
*Assistant Examiner*—Cynthia Hamilton
*Attorney, Agent, or Firm*—Luther A. R. Hall

[57] ABSTRACT

Compositions which can be polymerised by radiation and are based on surface-active, conjugated diacetylene compounds of the formula $H(CH_2)_m-C\equiv C-C\equiv C-(CH_2)_n-A$ in which m and n=0 or 1–30 and m+n is at least 10 and A is a polar group, and which contain mixtures of such diacetylene compounds or are mixed with surface-active substances, are particularly suitable for use as a high-resolution photographic recording material.

9 Claims, No Drawings

POLYMERISABLE COMPOSITION COMPRISING CONJUGATED DIACETYLENIC COMPOUNDS, MATERIAL COATED THEREWITH AND THE USE THEREOF

The present invention relates to a composition which can be polymerised by radiation and is based on surface-active, conjugated diacetylene compounds, to a material coated with this composition and to the use thereof as a photographic recording material.

The use of substances which can be polymerised by radiation has acquired an increasing importance in the production of electronic and micro-electronic components. The progressive miniaturisation of the components also results in the introduction of photosensitive substances which can be applied to surfaces in very thin layers. The Langmuir-Blodgett technique, in which surface-active and photopolymerisable substances are first applied to a water surface and are transferred to the substrate by immersing the latter has proved to be a suitable method for the production of monomolecular films. Multiple layers are obtained by repeating this process. Examples of substances which are suitable for this technique are described in European Patent No. A-0,022,618, in which surface-active diacetylene compounds for coating substrates are disclosed. The result of irradiation, if appropriate through a framing mask is to give, for example, passivated layers or photographic images.

In the layers, the diacetylene compounds form regions of uniform orientation which are described as domains. The photopolymerisation takes place inside the domains and not beyond their limits. The resolution of photographic images is therefore co-determined by the size of the domains.

Resolutions within the range of about 100 Å are desirable for photographic and photolithographic systems. It is suggested in European Patent No. A-0,022,618 that the layers applied, having domain sizes of up to 800 μm, should first be subjected to heat treatment, in order to achieve a reduction in the size of the domains and thereby better resolution. Although a reduction in the size of the domains can, on average, be achieved by this uneconomic method, a wide scattering of ranges up to approx. 100 μm is observed. In addition, the reduction in size is attained by a disarrangement of the molecules, which are thereby withdrawn from polymerisation, which considerably reduces the conversion to polymer when irradiated and can result in defects in the polymerised films.

The object of the present invention is to provide a composition which can be polymerised by radiation and is based on surface-active, conjugated diacetylene compounds which can be directly precipitated in layers having small domain areas of magnitudes less than 20 μm and a fairly uniform distribution of magnitude and which display no undesirable decline in the conversion to polymer when irradiated.

The present invention relates to a composition which can be polymerised by radiation and is based on conjugated diacetylene compounds and contains (a) a diyne compound of the formula I $$H(CH_2)_m-C\equiv C-C\equiv C-(CH_2)_n-A \quad (I)$$

in which m and n independently of one another are 0 or an integer from 1 to 30 and the sum of $m+n$ is at least 10, n being at least 1, if the group A is not linked to the diine radical via a C atom, and A is a polar group, and (b1) at least one compound of the formula I which is different from (a), (b2) an alkane having 10 to 30 C atoms which can be substituted by a polar group A or (b3) a surface-active dye.

Preferably, m and n independently of one another are 0 or a number from 1 to 25. n is especially a number from 0 to 20. In particular, m and n are numbers from 2 to 16.

The group A is a polar group which imparts hydrophilic properties to the compounds of the formula I, while at the same time the hydrocarbon radical produces hydrophobic properties.

The following are examples of the polar group: —SH, —OH, —NR$^1$R$^2$ (amine), —COOR$^3$ (carboxyl or carboxylate), —CONR$^1$R$^2$ (amides), —OSO$_3$R$^3$ (sulfate), —SO$_3$R$^3$ (sulfonate), —OPO$_2$R$^3$R$^4$ (phosphite), —OPO$_3$R$^3$R$^4$ (phosphate), —PO$_3$R$^3$R$^4$ (phosphonate), —CN, pyridyl or bipyridyl. The amine groups can also be present in the form of quaternary ammonium salts or can be acylated. R$^1$ and R$^2$, independently of one another, can be a hydrogen atom, alkyl or cycloalkyl, and R$^1$ and R$^2$ together can be tetramethylene or pentamethylene or 3-oxapentylene. R$^3$ and R$^4$, independently of one another, can be a hydrogen atom, a cation, alkyl or cycloalkyl. The alkyl can be linear or branched and can contain up to 18, preferably 1 to 6, C atoms. The cycloalkyl preferably contains 5 to 7 ring C atoms. The cation is preferably an alkali metal or alkaline earth metal cation or an ammonium cation. Preferred groups A are —OH and —COOR$^3$.

The following are examples of compounds of the formula I:

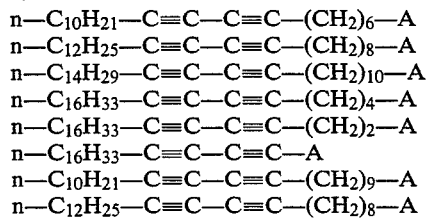

in which A is preferably one of the polar groups defined above, particularly —OH or —COOH.

The compounds of the formula I are known. Their preparation is described, for example, in J. of Poly. Science: Polymer Chemistry Edition, Volume 17, 1631–1644 (1979) or in European Patent No. A-0,022,618, or they can be prepared by analogous processes.

The component (b1) of the composition according to the invention can be an isomeric compound; a compound which differs in the number m and/or n and, additionally or only, in the polar group A.

The alkane of the component (b2) preferably contains 14 to 24 C atoms and, in particular, is linear. Examples are n-tetradecane, n-hexadecane, n-octadecane and n-eicosane. If the alkane is substituted by a polar group A, the polar group is preferably attached in a terminal position. Suitable polar groups A are the groups described above. The saturated fatty acids and their salts and amides, the alcohols and the amines are preferred. The compounds of the component (b2) are known.

Compounds containing pyridyl or bipyridyl as the polar group A for the components b1 or b2 can have the following formulae:

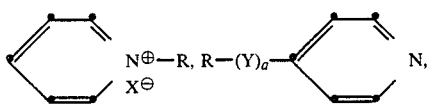

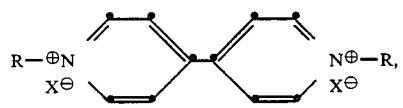

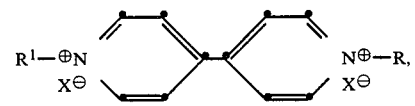

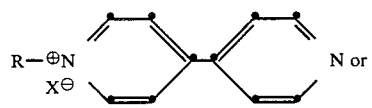

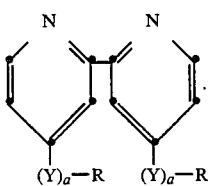

In these formulae, $X^\ominus$ is an anion, such as chloride, iodide, sulfate, methylsulfate or tosylate; R is a diine radical as defined above or alkyl having 10 to 30 C atoms, $R^1$ is a radical as defined above, Y is a bridging group, for example O, S, SO, $SO_2$, CO, $-CO_2-$ or $-NR^1-$, and a is 0 or 1.

Any dye which is substituted by one or more fairly long-chain, preferably linear, alkyl groups is suitable as the component (b3). The alkyl group preferably contains at least 10 C atoms and can be, for example, decyl, undecyl, dodecyl, tetradecyl, hexadecyl, octadecyl or eicosyl. Suitable dyes are familiar to those skilled in the art, as are also methods of introducing the alkyl groups into the dye molecule.

The following dyes may be mentioned as examples:

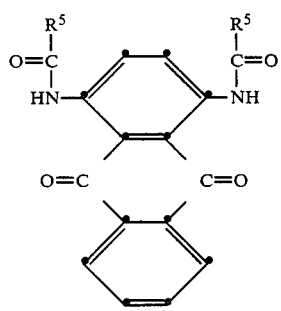

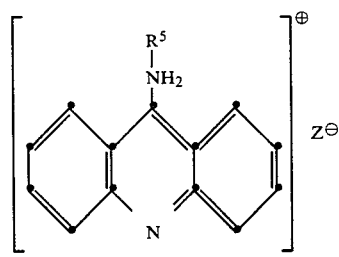

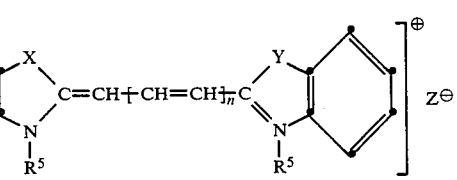

in which $R^5$ is preferably linear alkyl having 10 to 30, particularly 12 to 20, C atoms, X and Y are O, S or Se and Z is an anion, for example Cl, Br, I or $ClO_4$.

Mixtures containing the components (a) and (b1) and those containing the components (a) and (b3) are preferred. The following are examples of these: tricosa-10,12-diinoic acid/tricosa-4,6-diinoic acid, pentacosa-10,12-diinoic acid/pentacosa-4,6-diinoic acid, pentacosa-10,12-diinoic acid/N,N'-distearyl-1,4-diaminoanthraquinone.

The quantitative composition of the components (a) and (b1) can be 1 to 99% by weight, preferably 5 to 95% by weight and especially 10 to 90% by weight of the component (a) and 99 to 1% by weight, preferably 95 to 5% by weight and especially 90 to 10% by weight of the component (b1). Furthermore, 10 to 90% by weight, preferably 50 to 90% by weight of the component (a) and 90 to 10% by weight, preferably 50 to 10% by weight of the component (b2) can be present. The ratio of the components (a) and (b3) is preferably 99 to 80% by weight, particularly 99 to 90% by weight of the component (a) and 1 to 20% by weight, particularly 1 to 10% by weight of the component (b3).

The composition according to the invention can contain further customary additives, for example tackifiers, sensitisers, photoinitiators, dyes, pigments and fillers.

The compositions according to the invention can be polymerised by radiation, for example by electron radiation, laser radiation, X-rays and, particularly, UV radiation. They are therefore suitable for the production of protective coatings on substrates, as photographic image material, photoresists, for the storage of information and as components for micro-electronics and integrated optics, waveguides and frequency multipliers.

In this connection the composition can be applied to at least one surface of substrates by customary methods, such as dipping, rolling, spraying processes or curtain coating processes, if appropriate in the form of a solution in customary solvents, for example halogenated hydrocarbons. The layer thickness can be up to 50 μm or more. Examples of suitable substrates are semiconductors, metals, copper-lined panels, plastics, glass, quartz and ceramics. The surfaces can be finished with adhesion promoters in order to achieve better adhesion.

A particularly suitable process for applying the compositions according to the invention is the Langmuir-Blodgett method, which is described, for example, in European Patent No. A-0,022,618. In this process, monomolecular layers are deposited on the surfaces of the substrates. The progressive repetition of a process stage results in the deposition of several layers and 40 layers or more can be applied. The advantage of the method lies in the fact that uniform and defined layer thicknesses are applied.

The present invention also relates to substrates having a thin layer of the composition according to the invention on at least one surface. The use thereof for photographic images is preferred.

It has been found, surprisingly, that the compositions according to the invention are deposited directly on the substrate surfaces with the formation of small and uniform domains, less than 20 μm in size. It is even possible to achieve sizes within the μrange. By using the coated substrates as a photographic recording material, high resolutions of up to a range of 100 Å are therefore achieved. In some cases, particularly when using long-chain carboxylic acids, for example elaidic acid or stearic acid, the formation of superlattice structures is observed; these result in crystallites of a size extending into the cm range, without, however, having an adverse effect on the desired properties.

The composition according to the invention also has further advantages. The addition of the component (b1) is associated with an enhanced reactivity when irradiated, and the polymer has a substantially higher optical density (equivalent to a deeper colour). The addition of component (b2), particularly components having a polar end group, causes the monomolecular film on the surface of the water in the Langmuir-Blodgett method to have an increased stability, which permits higher immersion speeds of the substrates. The addition of the component (b3), particularly surface-active dyes possessing donor or acceptor properties, achieves an additional sensitisation of the photopolymerisation within the range of absorption of the dye.

The following examples illustrate the invention in greater detail.

EXAMPLE 1

A mixture of two isomeric diacetylene fatty acids. Tricosa-10,12-diynoic acid and tricosa-4,6-diynoic acid are dissolved in chloroform in a molar ratio of 10:4 and a total concentration of 1 mg/ml. This solution is spread out at 15° C. on an aqueous $CdCl_2$ solution (concentration: $3 \times 10^{-4}$ mole/liter) having a pH value of 7. The resulting monomolecular film is compressed to a film pressure of 20 mN/m. A quartz plate, which has previously been coated with 3 layers of cadmium arachidate, is then dipped vertically once into the water and lifted out again. The sample is then irradiated for 45 minutes with a UV lamp (6 W low-pressure mercury vapour lamp). The formation of the polymer is detected by absorption spectroscopy (spectrometer: Perkin-Elmer Hitachi 200) and the size of the domains is determined in a polarisation microscope (Zeiss Photomikroskop III).

The optical density of the polymer, which is a measure of the conversion achieved, and also the sizes of the domains are shown in Table 1.

EXAMPLE 2

A mixture of two surface-active diacetylenes having different polar end groups.

Pentacosa-10,12-diynoic acid and pentacosa-10,12-diynol are dissolved in chloroform in a molar ratio of 10:3 and in a total concentration of 1 mg/ml. The layer is prepared and polymerised as in Example 1. The optical density of the polymer and the sizes of the domains are shown in Table 1.

EXAMPLE 3

A mixture of a diacetylene fatty acid and a saturated alkane.

Pentacosa-10,12-diynoic acid and n-octadecane are dissolved in chloroform in a molar ratio of 10:3 and in a total concentration of 1 mg/ml. The layer is prepared and polymerised as in Example 1. The optical density of the polymerised sample and the size of the domains are shown in Table 1.

EXAMPLE 4

Mixtures of a diacetylene fatty acid and a surface-active dye.

Pentacosa-10,12-diynoic acid and bis-[3-stearyl-2-benzoselenazol]-trimethinecyanine iodide are dissolved in chloroform in a molar ratio of 100:3 and in a total concentration of 1 mg/ml. The layer is prepared as in Example 1. Polymerisation is carried out using a 200 W medium-pressure mercury vapour lamp with an interference filter, λ=579 nm.

The optical density of the polymer and the size of the domains are shown in Table 1.

TABLE 1

| Example No. | Size of domain [μm] (length × width) | Optical density (λ max) |
|---|---|---|
| 1 | 1 × 1 to 5 × 1 | 0.028 (545) |
| 2 | 0.6 × 1 | 0.027 (640) |
| 3 | 1 × 1 to 8 × 2 | 0.015 (640) |
| 4 | 3 × 15 | 0.010 (640) |

EXAMPLE 5

The following mixtures (molar ratio 10:4) are dissolved in chloroform and coated onto a quartz plate and the layer is polymerised in accordance with Example 3:
Tricosa-10,12-diynoic acid/stearic acid
Tricosa-10,12-diynoic acid/elaidic acid
Tricosa-10,12-diynoic acid/arachidic acid Layers having domain sizes in the region of 1–10 μm are obtained.

What is claimed is:

1. A composition which is polymerizable by radiation and is based on conjugated diacetylene compounds and contains (a) a diyne compound of the formula I $$H(CH_2)_m-C\equiv C-C\equiv C-(CH_2)_n-A \qquad (I)$$

in which m and n independently of one another are 0 or an integer from 1 to 30 and the sum of m+n is at least 10, n being at least 1, if the group A is not linked to the diyne radical via a C atom, and A is a polar group, and (b1) at least one compound of the formula I which is different from (a), (b2) an unsubstituted alkane having 10 to 30 C atoms or (b3) a surface-active dye containing at least one alkyl group which contains at least 10 C atoms and which is attached to a chromophoric molecule.

2. A composition according to claim 1, wherein m and n independently of one another are 0 or a number from 1 to 20.

3. A composition according to claim 1, wherein the polar group A is $-SH$, $-OH$, $-NR^1R^2$, $COOR^3$, $CONR^1R^2$, $-OSO_3R^3$, $-SO_3R^3$, $-OPO_2R^3R^4$, $-OPO_3R^4$, $-PO_3R^3R^4$, pyridyl or bipyridyl, in which formulae $R^1$ and $R^2$ are a hydrogen atom, alkyl or cycloalkyl and $R^1$ and $R^2$ together are tetramethylene or pentamethylene or 3-oxapentylene and $R^3$ and $R^4$ are a hydrogen atom, a cation, alkyl or cycloalkyl.

4. A composition according to claim 1, which contains 99–1% by weight of the component (a) and 1–99% by weight of the component (b1), based on the composition.

5. A composition according to claim 1, which contains 10 to 90% by weight of the component (a) and 90 to 10% by weight of the components (b1) or (b2) or 80 to 99% by weight of the component (a) and 1 to 20% by weight of the component (b3).

6. A composition according to claim 1, wherein the alkane (b2) is linear.

7. A composition according to claim 1, which contains a mixture of tricosa-10,12-diynoic acid/tricosa-4,6-diynoic acid, pentacosa-10,12-diynoic acid/pentacosa-4,6-diynoic acid or pentacosa-10,12-diynoic acid/N,N'-distearyl-1,4-diaminoanthraquinone.

8. A material composed of a substrate, on the surface of which a thin layer of a composition according to claim 1 has been applied.

9. A material according to claim 8, in which the layer is up to 50 μm thick.

* * * * *